United States Patent
Seven

[11] Patent Number: 6,154,094
[45] Date of Patent: Nov. 28, 2000

[54] HIGH POWER OUTPUT STAGE WITH TEMPERATURE STABLE PRECISELY CONTROLLED QUIESCENT CURRENT AND INHERENT SHORT CIRCUIT PROTECTION

[75] Inventor: Kazim Seven, San Jose, Calif.

[73] Assignee: National Semiconductor Corporation, Santa Clara, Calif.

[21] Appl. No.: 09/303,721

[22] Filed: Apr. 30, 1999

Related U.S. Application Data

[62] Division of application No. 08/987,801, Dec. 10, 1997.

[51] Int. Cl.[7] ................................................ H03F 3/45
[52] U.S. Cl. ........................... 330/252; 330/257; 330/261
[58] Field of Search .................................. 330/257, 252, 330/261, 255, 266, 267, 268, 272, 273, 274

[56] References Cited

U.S. PATENT DOCUMENTS

| | | | |
|---|---|---|---|
| 4,066,914 | 1/1978 | Gundry | 330/257 |
| 4,095,164 | 6/1978 | Ahmed | 330/257 |
| 4,319,181 | 3/1982 | Wrathall | 330/257 |
| 4,338,527 | 7/1982 | Nagano | 330/257 |
| 4,410,859 | 10/1983 | Kuwahara | 330/257 |
| 4,418,290 | 11/1983 | Nagano | 330/252 |
| 4,458,213 | 7/1984 | Quan | 330/267 |
| 4,568,840 | 2/1986 | Kenji | 330/257 |
| 4,570,128 | 2/1986 | Monticelli | 330/267 |
| 4,587,491 | 5/1986 | Koterasawa | 330/268 |
| 4,814,723 | 3/1989 | Botti | 330/263 |
| 5,179,355 | 1/1993 | Harvey | 330/265 |
| 5,294,892 | 3/1994 | Ryat | 330/253 |
| 5,410,274 | 4/1995 | Birdsall et al. | 330/265 |
| 5,412,344 | 5/1995 | Franck | 330/255 |
| 5,418,495 | 5/1995 | Harvey | 330/265 |
| 5,428,316 | 6/1995 | Molnar | 330/253 |
| 5,442,320 | 8/1995 | Kunst et al. | 330/267 |
| 5,475,343 | 12/1995 | Bee | 330/255 |
| 5,491,448 | 2/1996 | Naokawa et al. | 330/264 |
| 5,497,122 | 3/1996 | Somayajula | 330/253 |
| 5,512,857 | 4/1996 | Koskowich | 330/252 |
| 5,512,859 | 4/1996 | Moraveji | 330/267 |
| 5,537,079 | 7/1996 | Gosser et al. | 330/265 |
| 5,578,967 | 11/1996 | Harvey | 330/263 |

*Primary Examiner*—Robert Pascal
*Assistant Examiner*—Khanh Van Nguyen
*Attorney, Agent, or Firm*—Limbach & Limbach L.L.P.; Seong-Kun Oh

[57] ABSTRACT

An output stage driver circuit comprising two parallel class AB stages running at slightly different quiescent currents, the difference of which is scaled up through a current mirror is disclosed which provides a temperature stable precisely controlled quiescent current for the output stage. A current limited voltage source is provided to ensure inherent short circuit protection with instantaneous response to short circuit or excessive load current conditions.

20 Claims, 4 Drawing Sheets

HIGH POWER OUTPUT STAGE WITH TEMPERATURE STABLE PRECISELY CONTROLLED QUIESCENT CURRENT AND INHERENT SHORT CIRCUIT PROTECTION

This is a divisional of application Ser. No. 08/987,801, filed Dec. 10, 1997.

BACKGROUND OF THE INVENTION

1. Field of the Invention

The present invention relates to output stages of amplifiers. More particularly, the present invention relates to methods and apparatus for setting and controlling quiescent (bias) current and cross over distortion independently in amplifier output stages. In addition, the present invention relates to amplifier output stages with inherent short circuit protection.

2. Description of the Related Art

An output stage, as the final stage of amplifiers, generally deals with relatively large signals. The most challenging requirement in the design of the output stage is that it deliver the required amount of power to the load in an efficient manner. This implies that the power dissipated in the output stage transistors must be as low as possible. This is primarily due to the fact that the power dissipated in a transistor raises its internal junction temperature, and there is a maximum temperature (in the range of 150° C. to 200° C. for silicon devices) above which the transistor is destroyed. Other reasons for requiring high-power conversion efficiency are to prolong the life of the batteries used in battery-powered circuits, to permit a smaller, lower-cost power supply, or to obviate the need for cooling fans.

The output stage of an amplifier is generally designed to deliver a substantial amount of power into a low-impedance load with acceptably low levels of signal distortion. Therefore, the amplifier output stages are generally designed to have one or more of the following properties: large output current swing, large output voltage swing, low output impedance, and low standby power. Additionally, the output stage is further designed to have sufficiently good frequency response such that it will not present a limitation to the rest of the amplifier circuit.

The output stage power transistors are generally several hundred to thousand times bigger than the diode connected transistors that is used for their quiescent current setting, and thus, their base-emitter voltage $V_{BE}$ is different. Therefore, emitter degeneration resistors are used in both output stage power transistors and diode connected transistors to help in setting the quiescent current. However, as the temperature of output stage power transistors rises, the quiescent current changes as a result since the diode connected transistors are not at the same temperature as the output stage power transistors. Therefore, setting and controlling a temperature stable quiescent current has been a major challenge.

One conventional approach to this problem is through several mask changes to properly adjust the quiescent current. However, the quiescent current adjusted through several mask changes still exhibit variations among the different wafers due to process tolerances. Moreover, several mask changes to properly adjust the quiescent current takes significant amount of time, substantially prolonging the time to market period.

Furthermore, one of the major failures of these output stages is the possible burn-out of the output devices or interconnections due to accidental or transient overload conditions given that the output stages are designed to handle large signal swings at relatively high current levels. A typical example of such an overload condition would be the accidental short circuit of the output to the power supply or the ground terminals. In such cases, the burn-out of the output devices or other permanent damage to the monolithic circuit can be avoided by limiting the maximum available output current to a safe value. This safe value is determined by the size and layout of the output devices and by the maximum allowable power dissipation considerations.

FIG. 1 shows a conventional class AB output stage with short circuit protection which operates in the event of an output short circuit while the output voltage $V_{OUT}$ is positive. As shown, two resistors $R_{E1}$ and $R_{E2}$ in series are coupled between the emitter terminal of transistor $T_1$ and the emitter terminal of transistor $T_2$. Furthermore, the base terminal of transistor $T_3$ is coupled to the emitter terminal of transistor $T_1$, while the base terminal of transistor $T_1$ is coupled to the collector terminal of transistor $T_3$. As further shown in FIG. 1, the emitter terminal of transistor $T_3$ is coupled to the output node of the class AB output stage. Also shown in FIG. 1 are two diodes $D_1$ and $D_2$ coupled in series between the collector terminal of transistor $T_3$ and the base terminal of transistor $T_2$.

Accordingly, in the manner described above, a large current which flows through transistor $T_1$ in the event of a short circuit will develop a voltage across resistor $R_{E1}$ having a sufficient value to turn transistor $T_3$ on. The collector of transistor $T_3$ will then conduct most of the bias current $I_{BIAS}$ taking transistor $T_1$ out of its base drive. The current through transistor $T_1$ will therefore be reduced to a safe operating level. Thus, this short circuit protection approach ensures device safety.

However, the above short circuit protection approach has the disadvantage that under normal operating conditions, about 0.5 volt drop may appear across each resistors $R_{E1}$ and $R_{E2}$. This translates into an equivalent reduction in voltage swing at the output in each direction, thus resulting in reduction in efficiency.

FIG. 2 shows a conventional thermal shutdown circuit. As shown, a zener diode $Z_1$ is coupled between the base terminal of transistor $T_1$ and the emitter terminal of a turn-on transistor $T_2$. Transistor $T_2$ is normally configured to be off. As the chip temperature rises, the combination of the positive temperature coefficient of zener diode $Z_1$ and the negative temperature coefficient of transistor $T_1$ base-emitter voltage $V_{BE1}$ cancels each other such that the emitter voltage $V_{E1}$ of transistor $T_1$ remains unchanged.

Since the base voltage $V_B$ of transistor $T_2$ is obtained from the emitter voltage $V_{E1}$ of transistor $T_1$ with a resistor divider (comprising resistors $R_1$ and $R_2$), the base voltage $V_B$ of the of transistor $T_2$ likewise remains unchanged. On the other hand, the base-emitter voltage $V_{BE2}$ of transistor $T_2$ decreases with the increase in temperature at a rate of approximately 2 mV/° C. and transistor $T_2$ begins conducting. Naturally, the precise point at which transistor $T_2$ begins conducting would largely depend upon the parameters of the transistor $T_2$ itself. Thus, by setting the temperature of the base voltage $V_B$ of transistor $T_2$ at 150° C., thermal shutdown can be achieved.

In this manner, the turn-on transistor $T_2$ is configured to absorb the bias current of the amplifier, therefore virtually shutting down its operation in the event that the temperature exceeds a safe preset value.

The conventional output stages are generally voltage drivers and therefore lack inherent current limitation. To cure this, the output stages require some type of feedback for short circuit protection. The traditional method uses a resistor across the emitter-base junction of the short circuit protection transistor to turn it on once a threshold load current is passed. This, in turn, consumes the drive current of the output stage and therefore shuts it down. This approach, however, is not very precise since the exact value of the short circuit protection transistor base-emitter voltage $V_{BE}$ is not known at the elevated temperature beyond the safe preset value, and where the value of the resistor is too small to be accurately manufactured. For example, a resistor having a value of 0.25 Ohms is necessary for a threshold current of 2 amperes and a base-emitter voltage $V_{BE}$ of the short circuit protection transistor at 0.5 Volts.

In accordance with another approach, the output stage power transistor base current $I_B$ is used along with a complicated circuitry to perform the short circuit protection. However, since this latter approach involves the β of the power transistor, the total accuracy (for example, a desired accuracy of ±20% for a short circuit current of 2 A) protection in this manner significantly decreases. More particularly, since the base current $I_B$ of a bipolar transistor is approximately equal to the emitter terminal current $I_E$ divided by the β, the variation in the bipolar transistor emitter current $I_E$ is correspondingly reflected in the base terminal current $I_B$. Therefore, the β of the output stage power transistor significantly decreases the total accuracy since the β for a bipolar transistor varies greatly (for example, from 30 to 200) depending upon the specific wafer.

SUMMARY OF THE INVENTION

In view of the foregoing, the present invention is directed to a current controlled output stage that sets and controls the quiescent current and cross over distortion independently, thereby offering a very temperature stable quiescent current. Additionally, the power amplifier output stage according to the present invention prevents excessive short circuit current from flowing through the power transistors.

An apparatus including an amplifier output stage for controlling a temperature stable quiescent current and maintaining a low cross over distortion in accordance with one embodiment of the present invention includes a bias signal source configured to provide a bias signal; a first output stage coupled to said bias signal source configured to receive said bias signal and in accordance thereto generate a first stage signal; a second output stage coupled to said bias signal source and said first output stage configured to receive said bias signal and said first stage signal and in accordance thereto generate a second stage signal, the difference between said first and second stage signals forming a difference signal; and a signal scaler coupled to said bias signal source, said first output stage and said second output stage, configured to receive said difference signal and scale said difference signal in accordance with a predetermined scaling factor to thereby generate a scaled difference signal; where said scaled difference signal establishes the quiescent current for dc operating condition.

An apparatus including a current controlled buffer coupled to an output stage of an amplifier in accordance with another embodiment of the present invention includes a current generator for providing a constant current; a constant voltage source configured to provide a constant voltage; an amplifier coupled to said current generator for conducting said constant current, said amplifier further coupled to said constant voltage source for receiving said constant voltage; and a buffer terminal coupled to said amplifier for sinking or sourcing a buffer signal, wherein the magnitude of said buffer signal is less than or equal to said constant current.

A method for controlling a temperature stable quiescent current and maintaining a low cross over distortion in an amplifier output stage in accordance with yet another embodiment of the present invention includes the steps of providing a bias signal; receiving said bias signal and in accordance thereto generating a first stage signal; receiving said bias signal and in accordance thereto generating a second stage signal, the difference between said first and second stage signals forming a difference signal; and receiving said difference signal and scaling said difference signal in accordance with a predetermined scaling factor to generate a scaled difference signal; where said scaled difference signal establishes the quiescent current for dc operating condition.

A method for controlling a temperature stable quiescent current and maintaining a low cross over distortion in an amplifier output stage in accordance with yet another embodiment of the present invention includes the steps of providing a constant current; providing a constant voltage; conducting said constant current and receiving said constant voltage; and sinking or sourcing a buffer signal, wherein the magnitude of said buffer signal is less than or equal to said constant current.

These and other features and advantages of the present invention will be understood upon consideration of the following detailed description of the invention and the accompanying drawings.

DESCRIPTION OF THE PREFERRED EMBODIMENT

Figure 1:
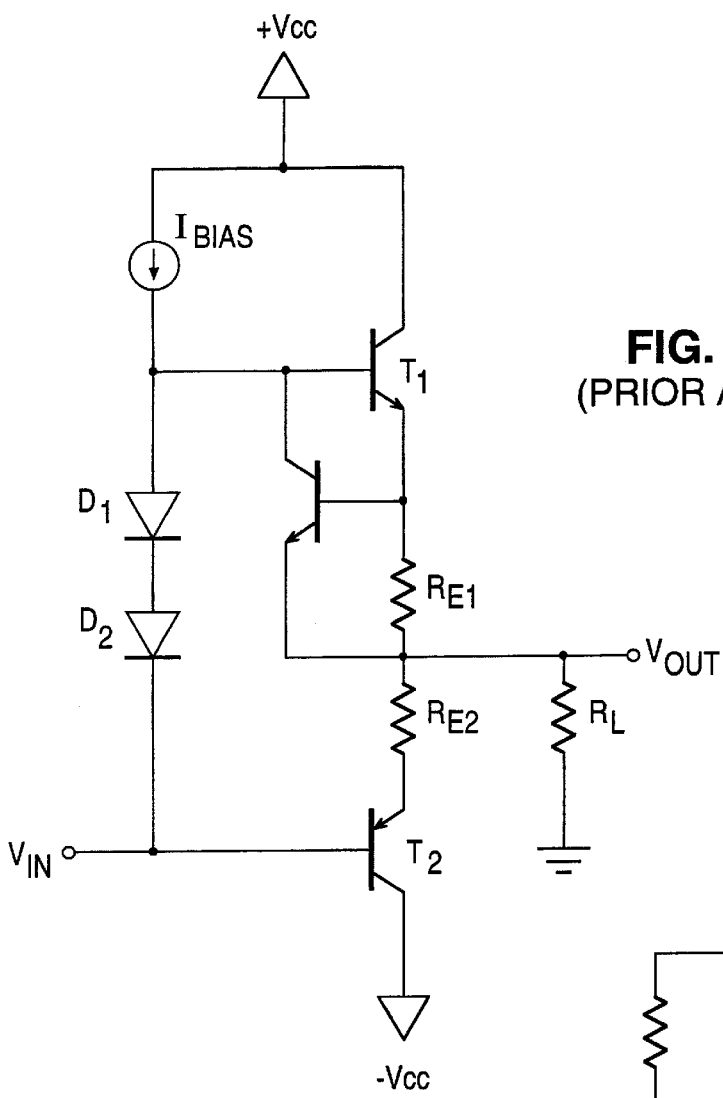
FIG. 1 shows a conventional class AB output stage with short circuit protection.
Figure 2:
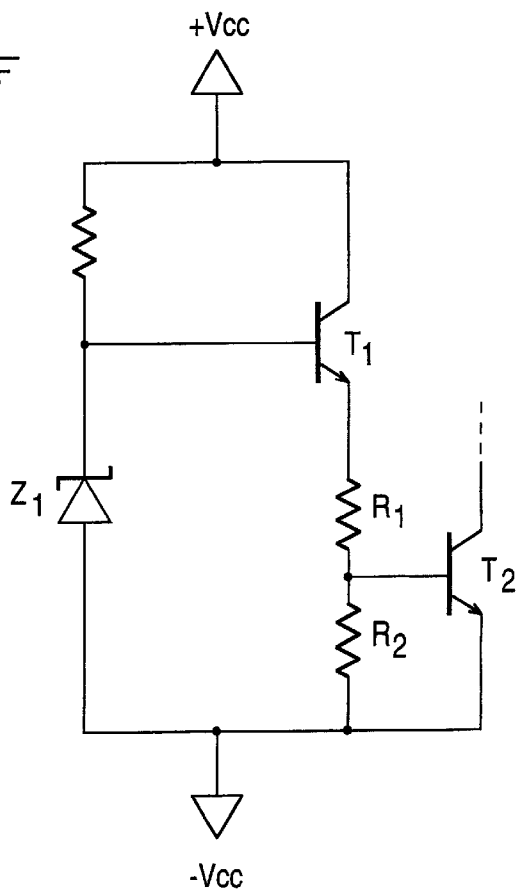
FIG. 2 shows a conventional thermal shutdown circuit.
Figure 3:
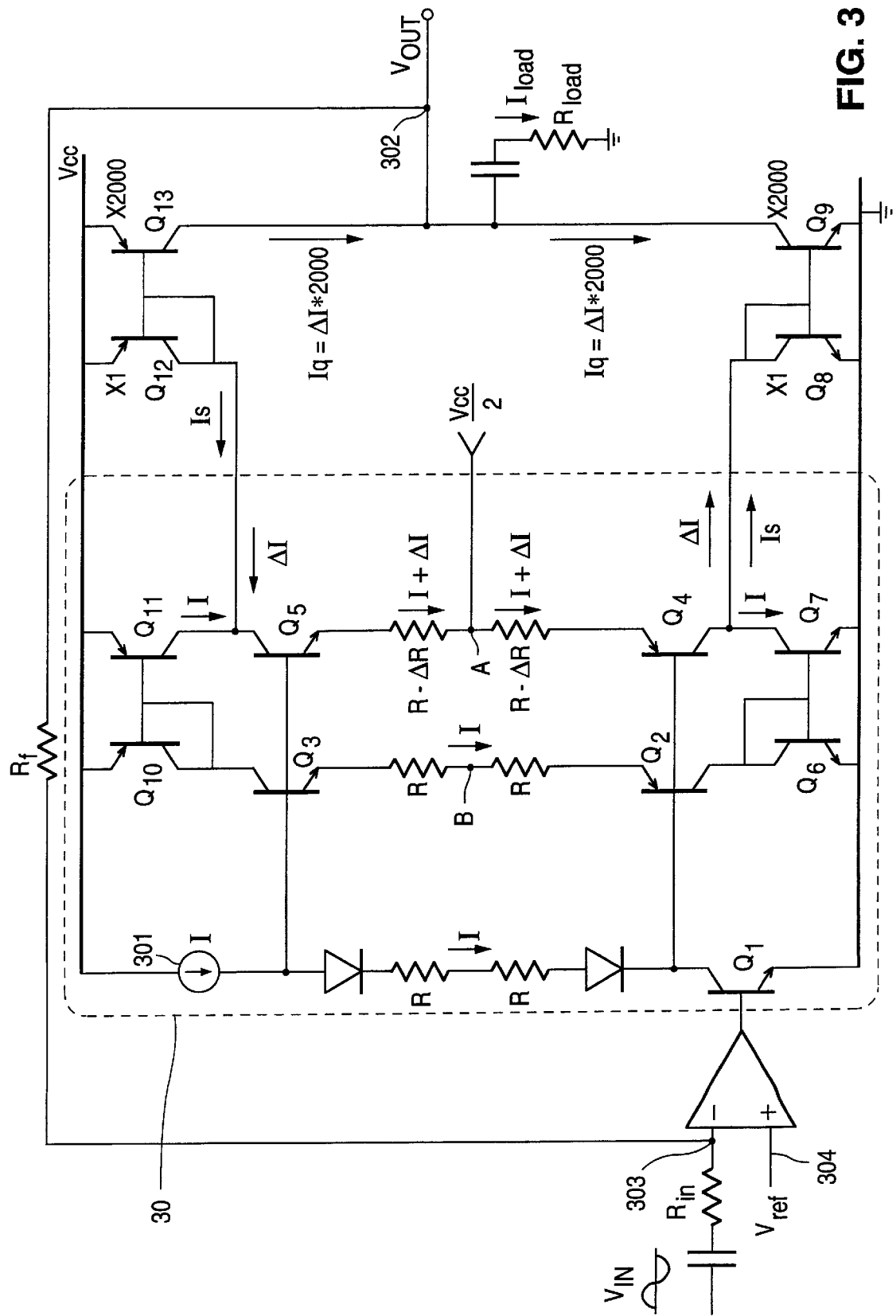
FIG. 3 shows a diagrammatic illustration of one embodiment of an output stage according to the present invention.

FIG. 3 illustrates a power amplifier output stage in accordance with one embodiment of the present invention. As shown, there are provided two parallel class AB stages including transistor pairs $Q_2$–$Q_3$ and $Q_4$–$Q_5$ in a driver circuitry 30. Further shown in FIG. 3 are a current source 301, two diodes $D_1$, $D_2$, and a transistor $Q_1$ which establish the operating conditions of transistor pairs $Q_2$–$Q_3$ and $Q_4$–$Q_5$. All resistors R are identical except the emitter degeneration resistors R—ΔR of transistor pair $Q_4$–$Q_5$ which are slightly smaller as compared to the resistors R. A feedback resistor $R_F$ is coupled between the output terminal 302 and the input terminal 303 of the output stage. The feedback resistor $R_F$ sets the operating point of the power amplifier output stage as well as establishing the gain of the power amplifier output stage in conjunction with the input resistor $R_{IN}$. Further coupled to node A is a voltage source $V_{CC}/2$ whose value is equal to the reference voltage $V_{REF}$ at the non-inverting input terminal 304. The voltage source $V_{CC}/2$ can be a conventional type such as a simple buffer circuit.

One of the two class AB output stages, transistor pair $Q_2$–$Q_3$, is configured to constantly operate at a fixed quiescent current I while the other class AB stage, transistor pair $Q_4$–$Q_5$, is configured to operate at a slightly higher current I+ΔI, the latter achieved by using smaller emitter degeneration resistor R—ΔR. The difference between the two quiescent currents I, I+ΔI, of the two class AB stages is then scaled up through a current mirror formed by transistors $Q_8$, $Q_9$, $Q_{12}$, and $Q_{13}$, to establish the quiescent current $I_Q$ of the power transistor output stage in accordance with the present invention.

In quiescent operating conditions, the current source 301 provides a constant current I which is duplicated by transistors $Q_2$ and $Q_3$ and mirrored by transistor pairs $Q_6$–$Q_7$ and $Q_{10}$–$Q_{11}$. The constant current I is then subtracted at terminals C and D from the collector current I+ΔI of transistors $Q_4$ and $Q_5$. The subtracted value ΔI, thus representing the difference between the constant current I and the collector current I+ΔI of transistor pair $Q_4$–$Q_5$, is multiplied by a current mirror ratio (for example, 2000 in accordance with one embodiment of the present invention) and thereby sets the output quiescent current.

Since the difference and not the absolute value of the currents in the two class AB driver stages sets the quiescent current $I_Q$ of the output stage, each class AB stage can have a sufficiently high current to minimize the cross over distortion while still maintaining the low quiescent current of the final output stage. Accordingly, the present invention allows small quiescent current in power amplifier output stage while maintaining a very low cross over distortion since the two class AB driver stages including transistor pairs $Q_2$–$Q_3$ and $Q_4$–$Q_5$ are biased with a relatively high current (for example, with constant current I, and not the difference ΔI) and the output mirror stages (comprising transistors $Q_8$, $Q_9$, $Q_{12}$ and $Q_{13}$) have linear characteristics.

Moreover, in accordance with the present invention, the driver circuitry 30 is configured to be positioned relatively far from the large transistors $Q_9$ and $Q_{13}$ which are the major heat sources. In this manner, the settings for the quiescent current $I_Q$ and the cross over distortions stay relatively unchanged. Furthermore, any rise in temperature at the power amplifier output stage does not change the difference between the two quiescent currents I and I+ΔI, of the parallel class AB stages transistor pairs $Q_2$–$Q_3$ and $Q_4$–$Q_5$, or the current mirror ratio (i.e., x2000). Therefore, the output quiescent current $I_Q$ in accordance with one embodiment of the present invention is temperature stable.

Figure 4:
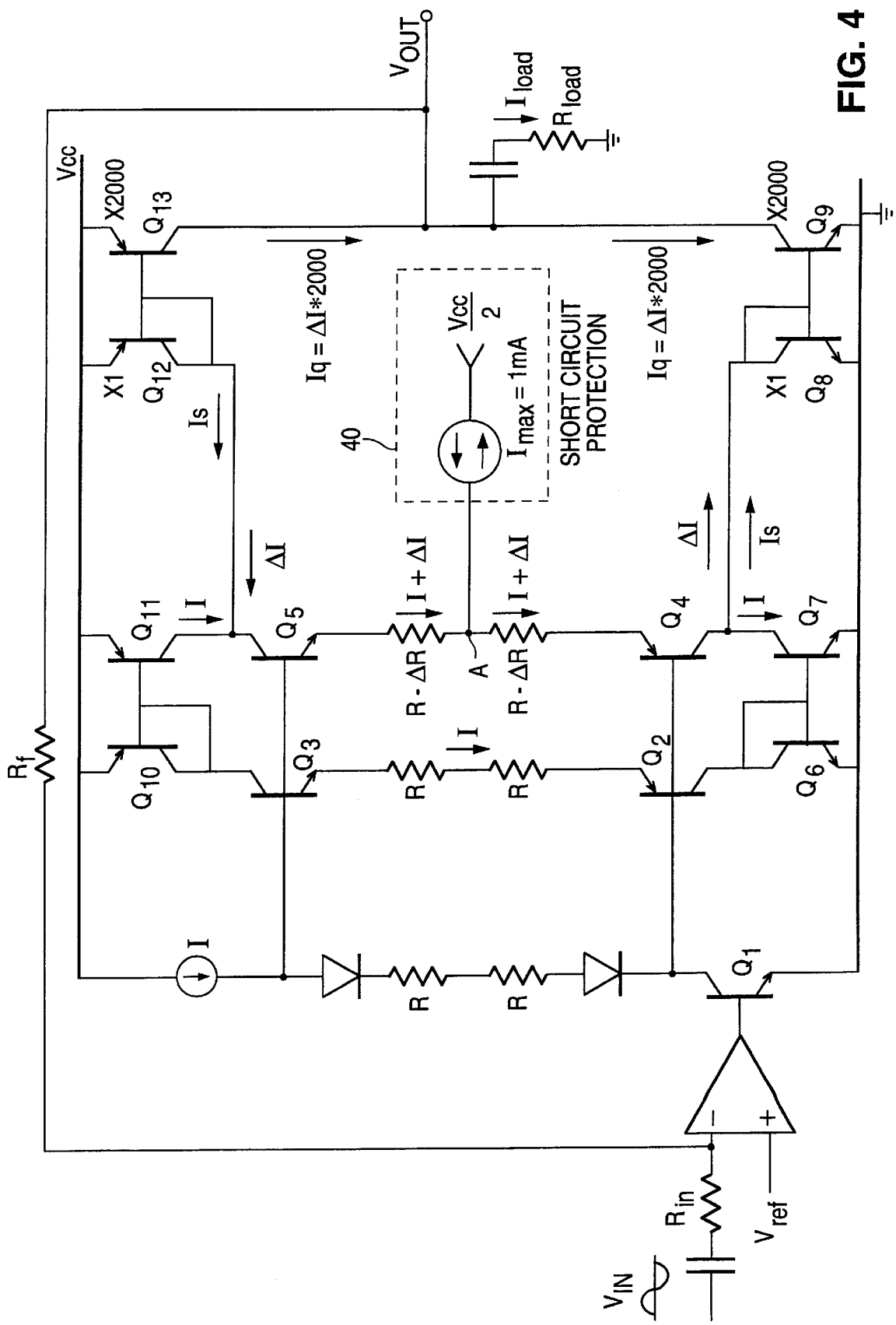
FIG. 4 shows a diagrammatic illustration of another embodiment of an output stage according to the present invention.

FIG. 4 illustrates another embodiment of the present invention. For simplicity, like parts of FIG. 3 as shown in FIG. 4 are labelled. in the same manner. As can be seen from FIG. 4, the voltage source $V_{CC}/2$ coupled to the node A in FIG. 3 is replaced with a current controlled buffer 40. The transistor pair $Q_4$–$Q_5$ operates as voltage-to-current converter with emitter degeneration resistors R—ΔR coupled thereto. The maximum load current $I_{MAX}$ (or otherwise known as power transistor current) along the emitter degeneration resistor R—ΔR depends upon the voltage difference $V_R$ across the emitter degeneration resistor R—ΔR. Thus, for the positive cycle of the ac input signal, the maximum load current $I_{MAX}$ can be determined in accordance with the following expression:

$$I_{MAX}=(V_{ES}-V_{CC}/2)/(R-\Delta R)*2000 \quad (1)$$

where $V_{ES}$ is the instantaneous voltage (which is dependent upon the input signal $V_{IN}$) at the emitter terminal of transistor $Q_5$.

Given equation (1) above, it can be seen that the voltage difference $V_R$ across the emitter degeneration resistor R—ΔR is measured in terms of current. In other words, the following expression can be determined:

$$(V_{ES}-V_{CC}/2)/R-\Delta R=V_R/R-\Delta R=I_S \quad (2)$$

where $I_S$ represents the instantaneous driver current signal before the multiplication of the output current mirror ratio, which, for example, is 2000.

As can be seen from equation (2) above, the instantaneous driver current $I_S$ is dependent upon the values of the voltage difference $V_R$ across the emitter degeneration resistor R—ΔR and the emitter degeneration resistor R—ΔR itself. Thus, in accordance with one embodiment of the present invention, the voltage difference $V_R$ across the emitter degeneration resistor R—ΔR can be clamped at a predetermined maximum value $V_{RMAX}$ such that the instantaneous driver current $I_S$ would be limited. In this manner, given that the maximum value of the driver instantaneous current $I_S$ is precisely limited at a predetermined value, it can be seen that the maximum output current and the short circuit current can also be defined precisely.

Referring back to FIG. 3, the instantaneous driver current $I_S$ is drawn from the voltage source $V_{CC}/2$ buffer configuration which is a low impedance voltage driver capable of providing substantially a flexible range of current demanded by the driver circuit. By contrast, as discussed above, in the embodiment of FIG. 4, the voltage source $V_{CC}/2$ buffer is replaced by the current controlled buffer 40 which is a current limited voltage source. The current controlled buffer 40 is described next.

Figure 5:
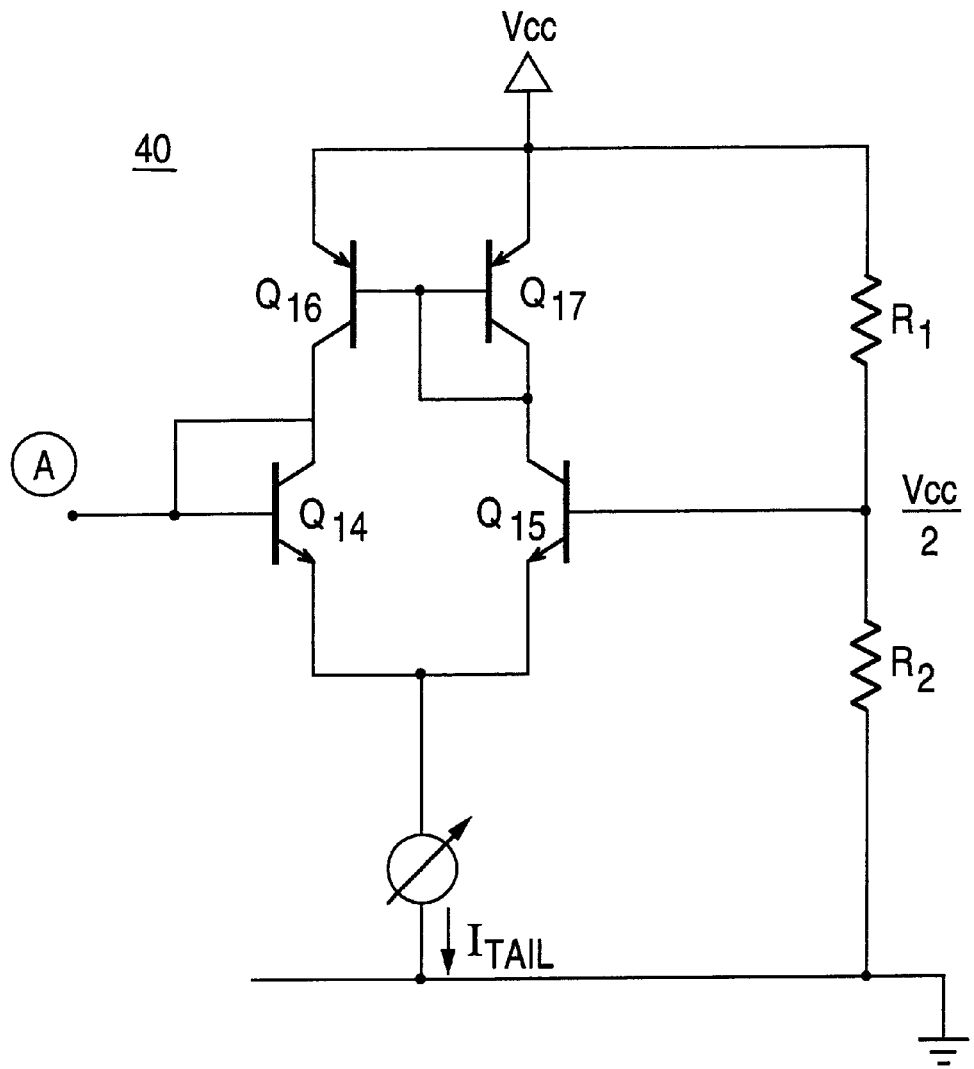
FIG. 5 shows a detailed view of the current limited voltage source of FIG. 4.

FIG. 5 illustrates the current controlled buffer 40 of FIG. 4 in accordance with one embodiment of the present invention. As shown, there is provided an emitter coupled transistor pair $Q_{14}$, $Q_{15}$ whose emitter terminals are coupled at node X to a constant current source 501. The constant current source 501 provides a tail current $I_{TAIL}$ to the two emitter terminals coupled at node X. Moreover, the base terminal of transistor $Q_{14}$ is configured as the output terminal of the current controlled buffer 40 (FIG. 4). Further provided in FIG. 5 is a current mirror formed by transistor pair $Q_{16}$–$Q_{17}$ which is coupled to the emitter coupled transistor pair $Q_{14}$–$Q_{15}$. Additionally, the base terminal of transistor $Q_{15}$ is coupled to two resistors $R_1$ and $R_2$.

Since the tail current $I_{TAIL}$ is set at 1 mA, it cannot deliver more than that amount of current to the output terminal A defined by the base terminal of transistor $Q_{14}$. Moreover, this value of tail current $I_{TAIL}$ determines the maximum value of the instantaneous driver current $I_{SMAX}$ which is dependent upon the input signal $V_{IN}$. Therefore, in a case where the transistor pair $Q_{14}$–$Q_{15}$ requires a higher current demand than the tail current $I_{TAIL}$, the current controlled buffer 40 refuses to deliver more than the tail current $I_{TAIL}$ as the instantaneous driver current $I_{SMAX}$.

Accordingly, the sink and source capability of the controlled current buffer 40 does not exceed the tail current $I_{TAIL}$ of the emitter coupled transistor pair $Q_{14}$–$Q_{15}$. Furthermore, the output of the controlled current buffer 40 maintains a value of $V_{CC}/2$ up to the value of the tail current $I_{TAIL}$ demanded by the driver circuitry 30 (FIG. 4) at terminal A. As the tail current $I_{TAIL}$ can be precisely set, the maximum output current can be precisely set at ($I_{TAIL}*2000$), thus providing inherent short circuit protection in accordance with the present invention.

In the manner described above, the present invention allows a current controlled output stage that sets and controls the quiescent current and cross over distortion independently, offering temperature stable quiescent current for the power output stage. One particularly well suited application for the present invention is for high power amplifier applications. Furthermore, the present invention allows prevention of short circuiting with no delays compared to conventional short circuit approaches which require shutting down of an output transistor with a feedback when short circuiting or excessive load current is detected.

Additionally, the present invention allows instantaneous response to short circuit protection as compared with approaches that use negative feedback which require a lag response time to activate the short circuit protection circuitry. Furthermore, in accordance with the present invention, the tail current $I_{TAIL}$ can be controlled in proportion with the collector-emitter voltage of the power transistors so as to provide a very dependable and precise safe operating area (SOA) to the power transistors.

Moreover, during the power on, standby, and mute switching of a device in an audio amplifier application, the tail current $I_{TAIL}$ can be controlled or completely cut so that the clicks and pops at the speaker output can be eliminated. Further, in accordance with the present invention, the tail current $I_{TAIL}$ can be controlled with the chip temperature such that the necessary drive can be reduced proportionally with the rising temperature. Since the dc values of the amplifier are maintained during thermal shutdown, the present invention avoids thermal oscillation thereby further reducing or eliminating the clicks and pops at the speaker outputs.

Finally, in accordance with the present invention, the tail current $I_{TAIL}$ can be controlled by the input signal amplitude such that it is possible to realize a "no-input signal, no-output drive" type power amplifiers. Such an amplifier exhibits high output impedance (tri-state) unless the input signal $V_{IN}$ is applied thereto, thus immune from any types of short circuit or loading.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a current controlled buffer coupled to an output stage of an amplifier, comprising:
   a current generator for providing a constant current;
   a constant voltage source configured to provide a constant voltage;
   an amplifier coupled to said current generator for conducting said constant current, said amplifier further coupled to said constant voltage source for receiving said constant voltage; and
   a buffer terminal coupled to said amplifier for sinking or sourcing a buffer signal;
      wherein the magnitude of said buffer signal is less than or equal to said constant current; and further
      wherein said magnitude of said buffer signal establishes a maximum output current of said output stage.

2. The apparatus of claim 1 wherein said constant voltage source includes a resistive divider.

3. The apparatus of claim 1 wherein said amplifier includes a differential amplifier coupled to said current generator and a current mirror coupled to said differential amplifier.

4. The apparatus of claim 3 wherein said differential amplifier includes a pair of emitter coupled transistors.

5. The apparatus of claim 2 wherein said amplifier includes a differential amplifier coupled to said current generator and a current mirror coupled to said differential amplifier.

6. The apparatus of claim 5 wherein said differential amplifier includes a pair of emitter coupled transistors.

7. The apparatus of claim 6 wherein said constant current is 1 mA.

8. The apparatus of claim 4 wherein said constant current is 1 mA.

9. The apparatus of claim 1 wherein said constant current is 1 mA.

10. A method for controlling a temperature stable quiescent current and maintaining a low cross over distortion in an amplifier output stage, said method comprising the steps of:
    providing a constant current;
    providing a constant voltage;
    conducting said constant current and receiving said constant voltage; and
    sinking or sourcing a buffer signal;
       wherein the magnitude of said buffer signal is less than or equal to said constant current; and further
       wherein said magnitude of said buffer signal establishes a maximum output current of said output stage.

11. The method of claim 10 wherein said step of providing said constant voltage includes the step of providing a resistive divider.

12. The method of claim 11 wherein said step of providing said constant current includes the steps of providing a current generator, coupling a differential amplifier to said current generator, and coupling a current mirror to said differential amplifier.

13. The method of claim 12 wherein said constant current is 1 mA.

14. The method of claim 10 wherein said step of providing said constant current includes the steps of providing a current generator, coupling a differential amplifier to said current generator, and coupling a current mirror to said differential amplifier.

15. The method of claim 14 wherein said constant current is 1 mA.

16. The method of claim 14 wherein said constant current is 1 mA.

17. An apparatus including a current controlled buffer coupled to an output stage of an amplifier to provide short circuit protection, comprising:
    a constant current source for providing a tail current;
    a constant voltage source configured to provide a constant voltage;
    an amplifier coupled to said constant current source configured to receive said tail current, said amplifier further coupled to said constant voltage source for receiving said constant voltage; and
    a buffer output terminal coupled to said amplifier for sinking or sourcing a buffer signal;
       wherein the magnitude of said buffer signal establishes a maximum output current of said output stage and the said buffer signal for sinking or sourcing at said buffer output terminal does not exceed said tail current.

18. The apparatus of claim 17 wherein said amplifier includes an emitter coupled transistor pair coupled to said constant current source and a current mirror coupled to said transistor pair.

19. The apparatus of claim 18 wherein one of said transistor pair includes a base terminal and further, wherein said buffer output terminal is coupled to said base terminal.

20. The apparatus of claim 17 wherein said tail current is 1 mA.

* * * * *